United States Patent
Hofmann

[11] 4,250,457
[45] Feb. 10, 1981

[54] FULL WAVE RECTIFIER ENVELOPE DETECTOR

[75] Inventor: Judson A. Hofmann, Schaumburg, Ill.

[73] Assignee: Zenith Radio Corporation, Glenview, Ill.

[21] Appl. No.: 17,526

[22] Filed: Mar. 5, 1979

[51] Int. Cl.³ .................... H03D 1/18; H02M 7/217
[52] U.S. Cl. .............................. 329/101; 307/350; 329/166; 363/127
[58] Field of Search ............... 329/101, 166; 307/231, 307/350, 362; 363/127

[56] References Cited

U.S. PATENT DOCUMENTS

| | | | |
|---|---|---|---|
| 3,070,750 | 12/1962 | Farber | 329/101 |
| 4,158,882 | 6/1979 | Citta | 363/127 |

OTHER PUBLICATIONS

D. F. Busch et al., "Transistor Half Wave Rectifier"; IBM Technical Disclosure Bulletin, vol. 1, No. 2, Aug. 1958, p. 36.

Primary Examiner—Siegfried H. Grimm
Assistant Examiner—Edward P. Westin

[57] ABSTRACT

A detector is described for fully rectifying a low level A.C. input signal without developing switching transients or substantial levels of undesirable signal components. The output of the detector is substantially equal to the square root of the sum of the square of the input signal and the square of a bias component. To remove the bias component, a linearity enhancer is described which receives the output of the detector and develops a further output substantially equal to the square root of the square of the A.C. input signal. The linearity enhancer may also be employed without the detector to remove undesired component from a signal which can be represented as the square root of a polynomial.

27 Claims, 5 Drawing Figures

FULL WAVE RECTIFIER ENVELOPE DETECTOR

BACKGROUND OF THE INVENTION

The invention described is directed to detectors for detecting the envelope of an electrical signal. The invention is additionally directed to electrical networks for improving the linearity of an electrical signal which can be expressed in terms of a polynomial.

In the past, it has been common practice to detect the envelope of an AM modulated signal by using a diode detector. Such detectors are commonly used as video detectors in television receivers.

A well known problem associated with diode detectors is that their output is generally not as linear as desired when driven by low level signals. To achieve a commonly accepted degree of linearity, the signal which is to be detected by the diode detector is caused to have a relatively large amplitude. In that manner, the diode operates on the more linear portion of its transfer curve. However, in modern television receivers constructed with integrated circuit chips, a high amplitude video signal may not be readily available for application to the diode detector. Hence, increased non-linearity in the detected video signal results.

Further, the degree to which a diode detector develops a linear output depends substantially on the quiescent bias applied to the diode. Hence, that bias level must be maintained very accurately at a predetermined level. Even so, the output of the diode detector is not as linear as is desired. Similar problems are experienced in applications other than television when diode detectors are used.

Another commonly encountered problem, whether it be in connection with a signal detector or not, is that a signal to be processed may contain a component which is desired to be recovered and an undesired component which contributes to non-linearity in the signal. Frequently, such a signal to be processed is expressable in terms of a polynomial. For example, where the composite signal to be processed is expressable in terms of the sum of the squares of a desired component and an undesired component, it is generally desired to process the composite signal so that the resultant signal is equal only to the square root of the square of the desired component of the composite signal. In the past, electrical networks for providing that function have been unduly complex or have not completely eliminated the undesired component of the composite signal. In particular, there has been no satisfactory network for removing undesirable components from the output of signal detectors so as to increase the resultant linearity of their detected signal.

OBJECTS OF THE INVENTION

It is a general object of the invention to provide an improved signal detector which overcomes the deficiencies noted above in connection with conventional detectors.

It is a more specific object of the invention to provide a detector for detecting the envelope of an electrical signal so as to develop an output signal which is substantially free of signal components contributing to non-linearity.

It is a further object of the invention to provide such a signal detector which is simple in construction, readily adaptable to fabrication on an integrated circuit chip, and capable of developing a linear output in response to a low level signal input.

It is another object of the invention to provide a linearity enhancement network for removing from a received signal, components which contribute to non-linearity in the received signal.

BRIEF DESCRIPTION OF THE FIGURES

The above stated objects and other objects of the invention are more particularly set forth in the following detailed description and in the accompanying drawings of which.

SUMMARY OF THE INVENTION

The envelope detector described herein is adapted to receive a low level A.C. input signal and to develop a fully-rectified version of the input signal without switching transients or other undesired components. Towards this end, the detector includes a first transistor means conducting a predetermined bias current, receiving the input signal, and developing at an output terminal a half-wave rectified version of the input signal. The other half of the input signal is rectified by a second transistor means receiving the input signal and developing a half-wave rectified version thereof on cycles of the input signal alternate to those rectified by the first transistor means.

In a preferred embodiment, the first transistor means operates in a common-base mode so that it does not invert the input signal on conduction. The second transistor means preferably operates in a common-emitter mode so that it does invert the input signal on conduction.

To maintain high linearity in the output signal, means are included for establishing the same bias current in each of the first and second transistor means and the same current gain therein. Hence, the first and second transistor means conduct at corresponding phase angles of alternate half cycles of the input signal and develop half-wave rectified outputs which are equal in amplitude and substantially free of undesirable harmonics.

The preferred embodiment achieves equal current and gain of the first and second transistor means by including the second transistor means in a current mirror which receives the bias current of the first transistor and mirrors that current in the second transistor means.

The output of the detector corresponds to the square root of the sum of the square of the input signal plus the square of the bias current. By selecting the bias current to be small compared to the signal current, the detector output is essentially the square root of the square of the input signal.

To develop even a more linear output, a linearity enhancer is described which may receive the output of the detector as well as selected amplitude and polarity of the bias current associated with the detector. The enhancer processes the detector output and the bias current to develop a further output signal from which the bias component of the detector output is removed.

In a preferred embodiment, the linearity enhancer includes transistor means receiving the detector output and selected amplitude and polarity of the bias current associated with the detector for conversion thereof to a signal voltage which is proportional to the square of the detector output minus the square of the bias current. Means responsive to the signal voltage develops a final output current proportional to the square root of the signal voltage. Hence, the final output current corresponds substantially to the square root of the square of the input signal received by the detector.

DESCRIPTION OF THE PREFERRED EMBODIMENT

Figures 1, 2:
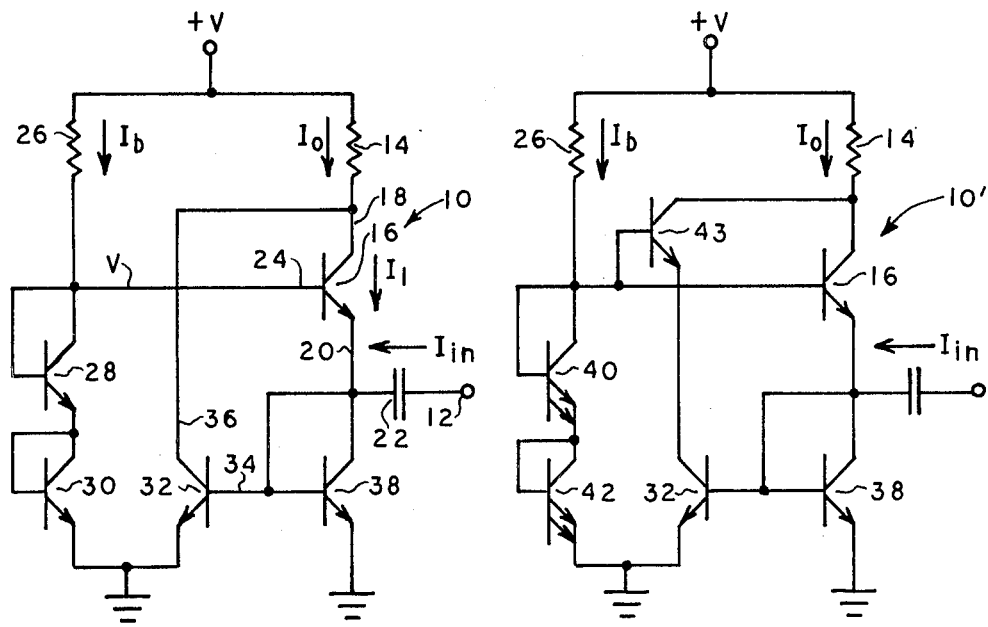
FIG. 1 is a circuit diagram of a detector embodying various aspects of the invention.
FIG. 2 is a circuit diagram of a modified version of the detector shown in FIG. 1.

Referring now to FIG. 1, there is shown a detector 10 which receives an A.C. input signal at an input terminal 12 and develops a substantially linear, although not perfectly linear, fully rectified version of the input signal across a load, indicated herein as a resistor 14.

The detector 10 includes a first transistor means, shown as a transistor 16, which has an output collector terminal 18 coupled to the load, an input emitter terminal 20 for receiving the input signal via a coupling capacitor 22, and a base terminal 24. The base terminal 24 is coupled to a biasing network comprising a resistor 26 and a pair of diode-connected transistors 28 and 30 coupled between a voltage source +V and a reference potential which may be ground. As is explained more fully below, the transistor 16 conducts on alternate half-cycles of an input current $I_{in}$ to develop across the load resistor 14 a voltage which includes an A.C. component related to the current $I_{in}$ and another component related to the bias current $I_b$ flowing in the resistor 26.

To rectify the current $I_{in}$ on cycles alternate to those during which the transistor 16 conducts, the detector 10 includes a second transistor means, shown as transistor 32. The latter transistor includes a base input terminal 34 receiving the input signal $I_{in}$, an emitter terminal coupled to a reference potential (shown as ground), and a collector output terminal 36 coupled to the output terminal 18 of the transistor 16.

With the above-described circuit configuration, it will be appreciated that the transistor 16 operates as a common-base amplifier with respect to the input signal $I_{in}$, while the transistor 32 operates as a common-emitter amplifier with respect to the input signal. Hence, on negative-going half cycles of the input signal, the transistor 16 conducts and develops a current through the resistor 14 such that a corresponding negative-going voltage is developed across the resistor 14. Because the transistor 16 operates as a common base amplifier with respect to the input signal, its current gain is approximately equal to unity, thereby generating an output current nearly identical to the current $I_{in}$ on those half-cycles of the current $I_{in}$ for which the transistor 16 is conductive.

On positive-going half cycles of the current $I_{in}$, the transistor 16 turns off and the transistor 32 operates as a common-emitter amplifier with respect to the current $I_{in}$, whereby the resultant voltage developed by the transistor 30 across the resistor 14 is inverted. That is, on positive-going half cycles of $I_{in}$, the transistor 32 develops negative-going half cycles of voltage across the load. As a result, each half-cycle of the input current is converted to a corresponding negative-going half cycle of voltage across the load. A fully-rectified version of the input signal $I_{in}$ is thus obtained.

An important aspect of the detector 10 is that the currents developed by the transistors 16 and 32 are substantially equal in magnitude, free of switching transients, and begin at corresponding phase angles of the input signal $I_{in}$. Consequently, the resultant output current Io is a quite linear, albeit a fully rectified, version of $I_{in}$. This result is achieved by causing the transistor 32 to have the same current gain as the transistor $Q_{16}$ and to conduct substantially identical quiescent bias currents. These results are preferably achieved by coupling the transistor 32 in a so-called "current mirror" circuit.

As shown, a current mirror is established by including in the detector 10 a third transistor means, illustrated as transistor 38. Specifically, the collector terminal of the transistor 38 is coupled to the emitter terminal 20 of the transistor 16, the collector and base terminals of the transistor 38 are coupled together and to the base terminal 34 of the transistor 32, and the emitter terminal of the transistor 38 is returned to the reference potential. With this arrangement, the quiescent current $I_l$ which flows in the transistor 16 also flows in the transistor 38. Moreover, that current $I_l$ must also flow through the transistor 32 because the voltage across the base-emitter junction of the transistor 32 is equal to the voltage across the base-emitter junction of the transistor 38. With the same quiescent current $I_l$ flowing in the transistors 16 and 32, each transistor will begin conducting at corresponding phase angles of alternate half cycles of the input current $I_{in}$.

Further, the operation of the current mirror insures that the current gain of the transistor 32 is substantially equal to the current gain of the transistor 16. This effect can be appreciated by recalling that the current gain of the transistor 16 is approximately unity. Also, the current gain of a current mirror can be expressed as $h_{fe}$ divided by $(h_{fe}+2)$ where the current mirror transistors 32 and 38 have substantially equal current gain $(h_{fe})$ and substantially equal base-emitter junctions. Where $h_{fe}$ is much larger than 2 as it usually is, the gain of the current mirror is approximately unity. Hence, the currents generated by the transistors 16 and 32 in response to the input current $I_{in}$ are substantially equal in amplitude.

This equality in the current gains of the transistors 16 and 32 is particularly important where the input current $I_{in}$ is an amplitude modulated radio-frequency signal, for imbalance in those current gains will result in undesirable radio frequency components in the output current $I_o$. Normally, such an input signal results in a fully rectified output signal across the resistor 14 which includes the fully rectified modulation envelope plus components whose frequency is twice that of the radio frequency. The double-frequency components may then be removed from the output signal by conventional filtering techniques. By balancing the current gains of the transistors 16 and 32, the output will include substantially no components whose frequency is equal to the radio frequency.

To further illustrate the versatility and advantages of the detector 10, its operation can be described from another standpoint. Assuming that a bias current $I_b$ flows, as indicated, in the resistor 26, and that the detector 10 receives an input current $I_{in}$, it can be shown that the voltage V at the base of the transistor $Q_{16}$ can be written as:

$$V = T_T \ln \frac{I_l}{I_S} + V_T \ln \frac{I_l + I_{in}}{I_S}$$

where $V_T = KT/Q$, K is Boltzmann's constant, T is the temperature in degrees Kelvin, Q is the charge of an electron, $I_S$ is the transistor base-emitter junction reverse saturation current, and $I_l$ is the emitter current of the transistor 16. A similar equation can be written for V in terms of the emitter currents of the transistors 28 and 30. The equations referred to above for V can be algebraically manipulated to express the output current $I_o$ in terms of $I_b$ and $I_{in}$ (taking into account the collector current of the transistor 32) as:

$$I_o = \pm \sqrt{I_{in}^2 + 4I_b^2}$$

It can be seen, therefore, that $I_o$ is approximately equal to $\sqrt{I_{in}^2}$ when $I_{in}$ is much larger than $I_b$, thereby providing a relatively linear output current. Alternately, the detector 10 is useful in applications where it is desirable to generate a signal corresponding to the square root of the sum of the square of two inputs $I_{in}$ and $I_b$, for example. Moreover, the current $I_b$ need not be solely a D.C. biasing current, but it may also include a signal current. Accordingly, the term "bias current", as it is used herein in connection with the current $I_b$ is used in a comprehensive sense to indicate a totally D.C. current or a current which may include a signal component.

In applications where it is desirable to minimize components of $I_b$ from the output current $I_o$, the biasing network of FIG. 1 is preferably modified as shown in the detector 10' of FIG. 2, wherein corresponding elements of FIGS. 1 and 2 have been given corresponding reference numerals. As shown in FIG. 2, the only modification to the biasing network is the replacement of transistors 28 and 30 by transistors 40 and 42. Although the function of the transistors 40 and 42 is the same as the function of transistors 28 and 30, the base-emitter junction areas of the transistors 40 and 42 is twice that of transistors 28 and 30, as indicated schematically by the double emitter symbols. In the latter embodiment, the base-emitter junction areas of the transistors 16, 38, and 32 are all selected to be substantially equal to a factor A, and the base-emitter junction areas of the transistors 40 and 42 are selected to be substantially equal to a factor $A_l$ divided by A. Preferably, $A_l$ is selected to be twice as large as A, whereupon the expression for Io becomes:

$$I_o = \sqrt{I_{in}^2 + I_b^2}$$

Clearly, the output current $I_o$ has been made to be a lesser function of $I_b$ by utilizing the biasing network shown in FIG. 2.

An additional modification to the detector 10 is the inclusion of another transistor 43 for coupling the output of the transistor 32 to the load. As shown, the emitter terminal of the transistor 43 is coupled to the collector terminal of the transistor 32, the base terminal of the transistor 43 is coupled to the resistor 26, and the collector terminal of the transistor 43 is coupled to the load resistor 14. In this configuration, transistors 32 and 43 operates as a cascode amplifier so that the load is driven in cascode for each cycle of $I_{in}$, and high frequency components of the input signal $I_{in}$ are further isolated from the load resistor 14.

Figure 3:
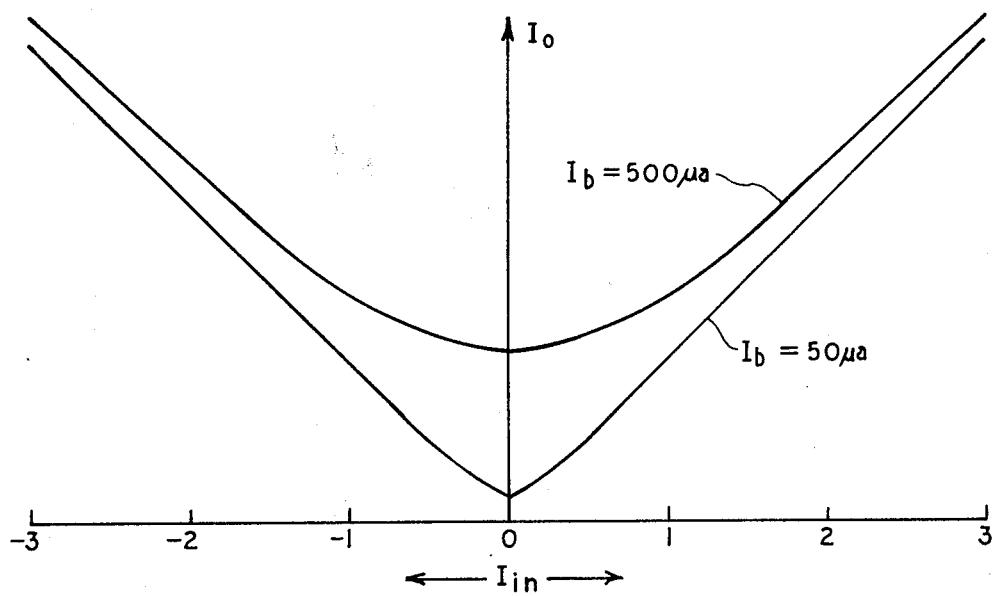
FIG. 3 is a plot of output current versus input current for the detector of FIG. 1 to illustrate its linear operation.

The degree of linearity achieved by the detector 10 is shown graphically in FIG. 3 wherein $I_o$ is plotted as a function of $I_{in}$. As shown, when $I_b$ equals 500 microamperes, the output current $I_o$ is linearly related to $I_{in}$ over a substantial range. However, when $I_b$ is reduced to 50 microamperes, $I_o$ becomes a linear function of $I_{in}$ over a greater range, particularly at very small amplitudes of $I_{in}$.

The results shown in FIG. 3 illustrate the operation of the detector when the biasing network of FIG. 1 is employed. When the biasing network of FIG. 2 is employed, even greater linearity is obtained.

Although the detectors 10 and 10' have been illustrated as utilizing a particular current mirror configuration, i.e., the circuit combination of transistors 32 and 38, other current mirror configurations may be used. Moreover, the detector need not utilize the transistors 28 and 30 (or 40 and 42) in the biasing network. For some applications, a resistive biasing network may suffice. In such applications, the output current $I_o$ can also be expressed in terms of the voltage V developed by the resistive biasing network and applied to the base of the transistor 16 as:

$$I_o = \sqrt{I_{in}^2 + 4I_S^2 \exp\left(\frac{V}{V_T}\right)}$$

where the terms $I_S$ and $I_T$ have their previously described definitions. The term "$4I_S^2$" exp $(V/V_T$ may be reduced to a term "$B^2$", indicating that the detector 10 still develops an output current equal to the square root of a sum of squared terms. However, for many applications, it is preferable to employ the biasing network which includes the transistors 40 and 42 (or 28 and 30) so that the operation of the detector remains uniform with changes in ambient temperature.

In utilizing the detector, its input impedance may have to be taken into consideration for certain applications. Where maximum linearity is required and a high input impedance can be tolerated, an $I_b$ of about 10 microamperes is suitable. For other applications, such as for use as a video detector in a television receiver, a low input impedance may be required. In the latter application, an $I_b$ of about 100 microamperes has been found to provide a reasonable compromise between linearity and input impedance.

According to another aspect of the invention, the output of the detector may be further processed to improve its linearity by utilizing a linearity enhancer which operates somewhat similarly to the detector itself. Am embodiment of such an enhancer is shown in FIG. 4, to which reference is now made.

The illustrated linearity enhancer 44 is designed to process a signal corresponding to the square root of a sum of squares and to remove one of the squared sum terms. For example, where a signal S may be represented as: $S = \sqrt{A^2 + B^2}$ and where the $B^2$ term is desired to be removed, the enhancer 44 develops a further signal Si equal to $\sqrt{A^2}$. Hence, the linearity enhancer may be considered as a polynomial manipulator for removing one term of the polynomial describing the input signal.

Figure 4:
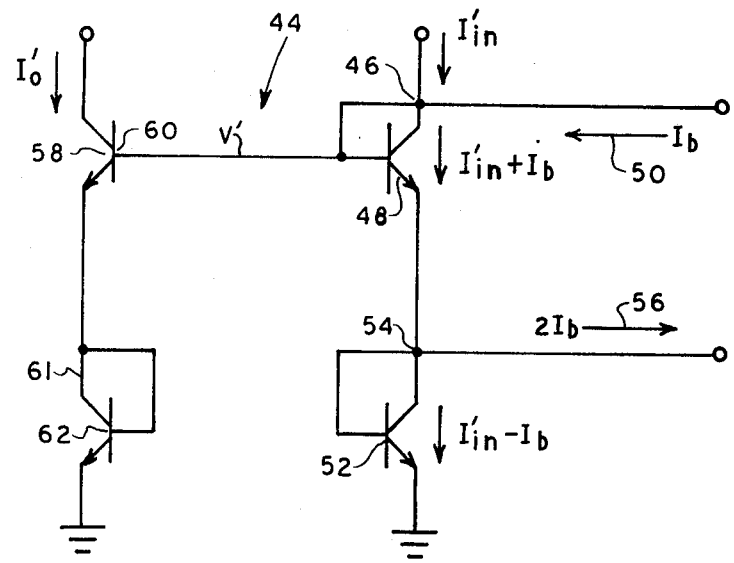
FIG. 4 is a circuit diagram of a linearity enhancer embodying other aspects of the invention.

In the embodiment of FIG. 4, the enhancer 44 receives an input current $I'_{in}$ which can be represented as the square root of $(A^2 + B^2)$, and receives selected amplitude and polarity of a current $I_b$ related to the $B^2$ terms. In response, the enhancer 44 develops an output current $I_o'$ from which the $B^2$ term is removed so that $I_o'$ equals $\sqrt{A^2}$. From the discussion which follows, it will be apparent that either the $A^2$ term or the $B^2$ term can be removed from the output current $I_o$ by appropriately selecting the inputs to the enhancer 44.

Although the enhancer 44 is not limited to use with a detector, a full-wave rectifier, or the like, its operation will now be described in terms of the way in which it is used to improve the linearity of the output signal developed by the detector 10' illustrated in FIG. 2.

Recalling that the output current of the detector 10' is represented as $I_o = \sqrt{I_{in}^2 + I_b^2}$, that output current is applied to the enhancer 44 as $I_{in}'$ at the collector terminal 46 of a diode-connected transistor 48. A current $I_b$, corresponding to the current $I_b$ of FIG. 2, and of the polarity indicated by the arrow 50, is also received at the terminal 46.

A second diode-connected transistor 52 is connected via its collector terminal 54 to the emitter terminal of the transistor 48. In addition, a current corresponding to twice the amplitude of the current $I_b$ and of the polarity indicated by the arrow 56 is pulled from the collector terminal of the transistor 52. By this arrangement, the transistor 48 conducts a current equal to $(I_{in}' + I_b)$, and the transistor 52 conducts a current equal to $(I_{in}' - I_b)$. It can be shown, therefore, that the voltage V' developed at the collector terminal 46 of the transistor 48 is proportional to $(I_{in}' + I_b)$ times $(I_{in}' - I_b)$, or $(I'_{in}^2 - I_b^2)$. Where $I'_{in}$ equals the square root of $(I_{in}^2 + I_b^2)$ (the output of the detector 10') the term $I_b$ drops out of the expression for V' so that V' is proportional to $I_{in}^2$.

The voltage V' is further processed by a transistor 58 which receives the voltage V' at its base terminal 60. The emitter terminal of the transistor 58 is coupled to a collector terminal 61 of a diode-connected transistor 62 whose emitter is grounded. As a result of this circuit configuration, it can be shown that the collector current $I_o'$ of the transistor 58 is proportional to the square root of the voltage V'; that is, $I_o'$ is proportional to the square root of $I_{in}^2$, where $I_{in}$ is the input current to the detector of FIG. 2. Hence, the $I_b$ component of the current developed by the detector of FIG. 2 is removed by the operation of the enhancer 44. When the detector of FIG. 2 and enhancer 44 are used together, a composite full-wave rectifier (or detector) is provided whose output is highly linear (free of unwanted components).

Figure 5:
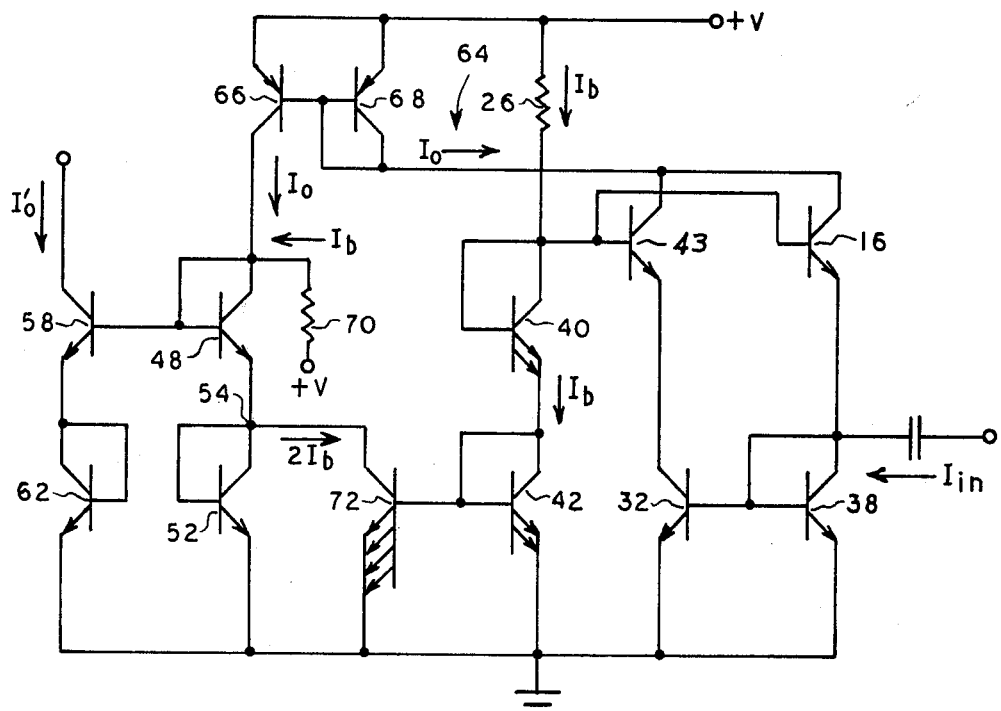
FIG. 5 is a circuit diagram illustrating a composite detector utilizing the detector of FIG. 2 and the linearity enhancer of FIG. 4.

A preferred composite detector 64 is shown in FIG. 5 in which elements corresponding to the elements of FIGS. 2 and 4 are identified by corresponding reference numerals. In this embodiment, the detector portion of the circuit develops a current $I_o$ corresponding to the square root of $(I_{in}^2 + I_b^2)$ where $I_{in}$ is the input signal current, and $I_b$ is the bias current. The input to the enhancer portion of the circuit is a current $I_o$ developed by a current mirror comprising transistors 66 and 68. The illustrated connection between the transistors 66 and 68, the transistor 16, and the transistor 48 causes the output current $I_o$ from the transistor 16 to be "mirrored" as an input to the transistor 48. The other input to the transistor 48, the current $I_b$, is developed in the illustrated embodiment by coupling the collector terminal of the transistor 48 through a resistor 70 to the voltage source +V. In this embodiment, the resistors 70 and 26 are of substantially equal value to develop substantially equal bias currents.

A current equal to $2I_b$ is pulled from the transistor 52 by coupling its collector terminal 54 to the collector terminal of a current sinking transistor 72, the latter having its base terminal coupled to the base terminal of the transistor 42 and having its emitter terminal grounded. As indicated by the four emitter symbols on the transistor 72, its base-emitter junction area is twice as large as the base-emitter junction area of the transistor 42. Hence, because the transistors 42 and 72 have equal base-emitter voltages, the transistor 70 conducts twice as much current, i.e., $2I_b$, as the transistor 42.

The composite detector 64 thus receives an input current $I_{in}$ and develops an intermediate output current $I_o$ substantially equal to the square root of $(I_{in}^2 + I_b^2)$. The enhancer portion of the composite detector receives the intermediate output current $I_o$ and the bias current $I_b$ and develops a final output current $I_o'$ from which the bias component is substantially, if not completely, removed. That is, $I_o' = \sqrt{I_{in}^2}$.

The detector described herein detects the envelope of an A.C. input signal by apparatus which is simple in construction and particularly adaptable to fabrication employing integrated circuit technology. It provides a highly linear output, substantially free of switching transients, even for low level input signals. This latter advantage renders the detector particularly suitable for use as a video detector in a television receiver or the like where the receiver's intermediate amplifier is incapable of providing a high level output.

In some applications, the detectors 10 or 10' may be utilized without the linearity enhancer 44, particularly where a low level signal is to be detected but further linearity improvement is not necessary. In addition, the detectors 10 or 10' may be employed wherever it is necessary to develop a signal which corresponds to the square root of the sum of two squared terms.

Where a very high degree of linearity is desired, it is preferable to utilize the composite detector 64, either as a detector or as a device for developing a signal corresponding to the square root of the square of a signal, i.e., the absolute value of a signal. Alternately, the enhancer may be used in applications not particularly associated with detectors, but as a polynomial corrector for removing one component of an input signal. For example, in a signal processor receiving an input signal, a portion of the processor may develop an intermediate signal corresponding to the square root of the sum of squares of the input signal and a further, undesired, signal component. The linearity enhancer may receive a current corresponding to the intermediate signal and a current corresponding to selected amplitude and polarity of the further signal component and convert the received currents to a voltage which is proportional to the square of the intermediate signal minus the square of the further signal component. The voltage is then converted to a final output current proportional to the square root of that voltage. Hence, the final output current corresponds substantially to the square of the input signal.

Although the invention has been described in terms of its preferred embodiment, it will be obvious to those skilled in the art that many alterations and modifications to the preferred embodiment may be made without departing from the invention. For example, the current mirrors may employ other transistor configurations and the biasing networks may be altered as needed for a particular application. Other obvious modifications may also be made. Accordingly, it is intended that all such alterations and modifications be included within the scope of the invention as defined by the appended claims.

What is claimed is:

1. An envelope detector for developing a fully rectified output signal in response to a low level input signal, comprising:

first transistor means having an input terminal and an output terminal, adapted to receive the input signal at said input terminal, and conducting a predetermined bias current such that a half-wave rectified version of the input signal is developed at said output terminal;

second transistor means having an input terminal receiving the input signal, having an output terminal coupled to the output terminal of said first transistor means, and arranged in a circuit configuration such that said second transistor means develops at its output a half-wave rectified version of the input signal on cycles of the input signal alternate to those rectified by said first transistor means; and third transistor means coupled to said second transistor means and receiving the bias current for causing said second transistor means to have substantially the same gain and to conduct substantially the same bias current as said first transistor means, whereby said first and second transistor means conduct at corresponding phase angles of alternate half-cycles of the input signal and develop a substantially linear, fully-rectified output signal which is free of switching transients and whose gain is substantially uniform.

2. An envelope detector as set forth in claim 1 wherein said third transistor means couples said second transistor means in a current mirror circuit for equalizing the bias current and gain of said first and second transistor means.

3. An envelope detector as set forth in claim 2 wherein said first transistor means is coupled in a common base configuration with respect to the input signal so as to conduct on negative-going half cycles of the input signal, and said second transistor means is coupled in a common emitter configuration with respect to the input signal to conduct on positive-going half cycles thereof.

4. An envelope detector as set forth in claim 3 wherein said third transistor means receives the bias current of said first transistor means and the input signal at a base terminal, and has base and collector terminals coupled together and to the input terminal of said second transistor means, whereby said second and third transistor means comprise a current mirror for maintaining the bias current and current gain of said second transistor means substantially equal to the bias current and current gain of said first transistor means.

5. An envelope detector as set forth in claim 4 further including fourth transistor means coupling the output of said second transistor means to the output terminal of said first transistor means for isolating high frequency components of the input signal from the output terminal of said first transistor means, said second and fourth transistor means forming a cascode amplifier.

6. An envelope detector for developing a fully rectified output signal in response to a low level input signal, comprising:

a first transistor having a collector terminal coupled to a load, a base terminal coupled to a source of D.C. bias, and an emitter terminal adapted to receive an A.C. input signal;

a second transistor having a collector terminal coupled to the load, an emitter terminal coupled to a reference potential, and a base terminal coupled to the emitter terminal of said first transistor;

a third transistor having a collector terminal coupled to the emitter terminal of said first transistor means, an emitter terminal coupled to the reference potential, and a base terminal coupled to the collector terminal of the third transistor, whereby positive-going cycles of the input signal increase the conduction of said second transistor to develop an increase in current through the load, and negative-going cycles of the input signal increase the conduction of said first transistor to develop a corresponding increase in current through the load, and said second and third transistors operate as a current mirror so that a fully-rectified, substantially uniform amplitude version of the input signal is developed across the load.

7. A detector for developing an output signal corresponding to the square root of the sum of the squares of a signal input current and a bias input current to the envelope detector, comprising:

first transistor means having a bias input terminal coupled to an input bias current, an output terminal coupled to a load, and a signal input terminal receiving the signal input current for developing an increasing current through the load on negative-going cycles of the input current;

second transistor means having an output terminal coupled to the load, and coupled in a current mirror configuration such that said second transistor means receives the signal input current at an input terminal and conducts substantially the same bias current as the said first transistor means, and such that said second transistor means exhibits substantially the same current gain as said first transistor means and conducts substantially only on positive-going cycles of the input current to develop a corresponding increase in the load current, whereby the load current corresponds to the square root of the sum of the squares of the signal input current and the input bias current.

8. A detector as set forth in claim 7 further including third transistor means coupling the output of said second transistor means to the load for isolating high frequency components of the signal input current from the load, said second and third transistor means forming a cascode amplifier.

9. A detector as set forth in claim 7 wherein said input bias current is derived from a network including first and second diode-connecting transistors, said first diode-connecting transistor having a collector coupled to a voltage source and to the bias input terminal of said first transistor means and an emitter terminal coupled to a collector terminal of said second diode-connected transistor, said second diode-connected transistor having an emitter coupled to a reference potential.

10. A detector as set forth in claim 9 wherein said first and second transistor means are selected to have emitter-base junction areas which are substantially equal to a factor A, and wherein said first and second diode-connected transistors are selected to have emitter-base junctions which are substantially equal to a factor $A_1$ which is greater than A, whereby the component of the bias input current present in the output signal across the load is reduced as a function of the square of $A_I$ divided by A.

11. A detector as set forth in claim 10 wherein $A_I$ is selected to be twice as large as A.

12. A detector as set forth in claim 7 further including means receiving the load current and the input bias current for developing a further signal corresponding substantially only to the square root of the square of the signal input current, whereby the further signal is substantially free of undesired components.

13. A detector as set forth in claim 12 wherein said first transistor means is coupled in a common base configuration with respect to the signal input current so as to conduct on negative-going half cycles of the signal input current, and said second transistor means is coupled in a common emitter configuration with respect to the signal input current to conduct on positive-going half cycles thereof.

14. A detector as set forth in claim 13 wherein said current mirror configuration includes third transistor means receiving bias current conducted by said first transistor means and the signal input current at a base terminal, and having base and collector terminals coupled together and to the input terminal of said second transistor means, whereby said second and third transistor means comprise a current mirror for maintaining the bias current and current gain of said second transistor means substantially equal to the bias current and current gain of said first transistor means.

15. A detector as set forth in claim 12 wherein said means for developing the further signal includes transistor means receiving a current corresponding to said load current and current corresponding to selected amplitude and polarity of said input bias current for developing a voltage substantially proportional to the square of the load current minus the square of the input bias current, further including transistor means responsive to said voltage for generating a final output current proportional to the square root of said voltage, thereby removing components of said input bias current from the final output current.

16. A detector as set forth in claim 15 wherein said first and second transistor means are selected to have emitter-base junction areas which are substantially equal to a factor A, and wherein said first and second diode-connected transistors are selected to have emitter-base junction which are substantially equal to a factor $A_l$ which is greater than A, whereby the component of the bias input current present in the output signal across the load is reduced as a function of the square of $A_l$ divided by A.

17. A detector as set forth in claim 15 wherein said transistor means for developing a voltage includes a first diode-connected transistor whose collector terminal receives a current corresponding to said load current and current substantially equal in amplitude and polarity to said input bias current, and a second diode-connected transistor having a collector terminal coupled to an emitter terminal of the first diode-connected transistor and coupled to a current sink drawing substantially twice the amplitude of the input bias current, and an emitter terminal coupled to a reference potential, whereby the voltage developed at the collector terminal of said first diode-connected transistor is proportional to the square of the load current minus the square of the input bias current.

18. A detector as set forth in claim 15 wherein said transistor means for generating the final output current includes a transistor in a common emitter configuration whose base terminal is coupled to the collector terminal of said first diode-connected transistor for developing the final output current at its collector terminal.

19. A composite detector for developing a highly linear, fully rectified version of a low level A.C. input signal, comprising:
means responsive to the A.C. input signal and to a bias current for generating an intermediate output current corresponding to the square root of the sum of the square of the A.C. input signal and the square of a current proportional to the bias current;
a linearity enhancer including means receiving a current corresponding to the intermediate output current and the bias current for conversion thereof to a signal proportional to the square of the intermediate output current minus the square of the bias current, and including means responsive to said proportional signal for developing a final output current proportional to the square root of said proportional signal, whereby the final output current corresponds substantially to the square root of the square of the A.C. input signal.

20. A detector as set forth in claim 19 wherein said means for developing a final output current includes transistor means receiving the current corresponding to the intermediate output current and current corresponding to selected amplitude and polarity of the D.C. bias current for developing a voltage substantially proportional to the square of the current corresponding to the intermediate output current minus the square of a current proportional to the D.C. bias current, including transistor means responsive to said voltage for generating a final output current proportional to the square root of said voltage.

21. A detector as set forth in claim 20 wherein said means for generating the intermediate output current comprises a full-wave rectifier having a plurality of transistors whose base-emitter junction areas are proportioned such that the intermediate output current corresponds substantially to the square root of the sum of the squares of the A.C. input signal and the D.C. bias current associated with said full-wave rectifier.

22. A detector as set forth in claim 21 wherein said transistor means in the linearity enhancer includes a first diode-connected transistor whose collector terminal receives the current corresponding to the intermediate output current and a D.C. current corresponding to the D.C. bias current associated with the full-wave rectifier, and a second diode-connected transistor having a collector terminal coupled to an emitter terminal of the first diode-connected transistor and coupled to a current sink drawing substantially twice the amplitude of the D.C. current received by said first diode-connected transistor.

23. A detctor as set forth in claim 22 wherein the full wave rectifier includes a network for developing the D.C. bias current, said network including first and second serially coupled, diode-connected transistors.

24. A detector as set forth in claim 23 wherein said current sink includes a transistor having a collector terminal coupled to the collector terminal of said second diode-connected transistor in the linearity enhancer, having a base terminal coupled to a base terminal of a selected one of the diode-connected transistors in the full-wave rectifier, said current sink transistor having a base-emitter junction area which is substantially twice as large as the base-emitter junction area of the diode-connected transistor to which its base terminal is coupled, whereby a D.C. current substantially equal to twice the amplitude of the D.C. bias current associated with the full-wave rectifier is drawn from the collector terminal of said second diode-connected transistor in the linearity enhancer.

25. A signal processor, comprising:
   means receiving an input signal for developing an intermediate signal corresponding to the square root of the sum of the squares of the input signal and a further signal component, and
   a linearity enhancer including means receiving a current corresponding to the intermediate signal and a current corresponding to selected amplitude and polarity of the further signal component for conversion of the received currents to a voltage proportional to the square of the intermediate signal minus the square of the further signal component, and including means responsive to said voltage for developing a final output current proportional to the square root of said voltage,
   whereby the final output current corresponds substantially to the square root of the square of the input signal.

26. A thermally self-compensating half-wave envelope detector means comprising:
   a first transistor having a collector coupled to a load and conducting a bias current and an emitter receiving a signal input current for developing an increasing current through the load on negative-going half-cycles of the input current;
   diode means coupled to said emitter of said first transistor and to a reference potential, said diode means developing an increasing current on positive-going half-cycles of the input current; and
   biasing means for developing a bias voltage coupled to the base of said first transistor, said biasing means having thermal and operational characteristics which track the thermal and operational characteristics of said first transistor and said diode means such that said bias current flowing through said first transistor and said diode means is maintained constant despite variations in parameters of said first transistor and said diode means.

27. The combined defined by claim 26 wherein said biasing means comprises first and second diode-connected transistors coupled in series, said first diode-connected transistor having a collector coupled to a voltage source and to said base of said first transistor and an emitter coupled to the collector of said second diode-connected transitor, said second diode-connected transistor having an emitter coupled to said reference potential.

* * * * *